US012328927B2

(12) United States Patent
Dewey et al.

(10) Patent No.: US 12,328,927 B2
(45) Date of Patent: Jun. 10, 2025

(54) LOW RESISTANCE AND REDUCED REACTIVITY APPROACHES FOR FABRICATING CONTACTS AND THE RESULTING STRUCTURES

(71) Applicant: Intel Corporation, Santa Clara, CA (US)

(72) Inventors: Gilbert Dewey, Beaverton, OR (US); Nazila Haratipour, Hillsboro, OR (US); Siddharth Chouksey, Portland, OR (US); Arnab Sen Gupta, Hillsboro, OR (US); Christopher J. Jezewski, Portland, OR (US); I-Cheng Tung, Hillsboro, OR (US); Matthew V. Metz, Portland, OR (US); Anand S. Murthy, Portland, OR (US)

(73) Assignee: Intel Coporation, Santa Clara, CA (US)

( * ) Notice: Subject to any disclaimer, the term of this patent is extended or adjusted under 35 U.S.C. 154(b) by 1109 days.

(21) Appl. No.: 17/033,499

(22) Filed: Sep. 25, 2020

(65) Prior Publication Data

US 2022/0102522 A1   Mar. 31, 2022

(51) Int. Cl.
*H01L 29/45*   (2006.01)
*H01L 21/285*   (2006.01)
(Continued)

(52) U.S. Cl.
CPC ....... *H10D 64/62* (2025.01); *H01L 21/28518* (2013.01); *H10D 30/024* (2025.01);
(Continued)

(58) Field of Classification Search
CPC ......... H01L 21/02603; H01L 21/28518; H01L 21/823431; H01L 21/823821;
(Continued)

(56) References Cited

U.S. PATENT DOCUMENTS

2003/0160324 A1   8/2003   Dragon
2010/0123198 A1   5/2010   Kim
(Continued)

OTHER PUBLICATIONS

Search Report from European Patent Application No. 21192890.8, mailed Feb. 9, 2022, 8 pgs.

*Primary Examiner* — David C Spalla
(74) *Attorney, Agent, or Firm* — Schwabe, Williamson & Wyatt P.C.

(57) ABSTRACT

Low resistance and reduced reactivity approaches for fabricating contacts, and semiconductor structures having low resistance metal contacts, are described. In an example, an integrated circuit structure includes a semiconductor structure above a substrate. A gate electrode is over the semiconductor structure, the gate electrode defining a channel region in the semiconductor structure. A first semiconductor source or drain structure is at a first end of the channel region at a first side of the gate electrode. A second semiconductor source or drain structure is at a second end of the channel region at a second side of the gate electrode, the second end opposite the first end. A source or drain contact is on the first or second semiconductor source or drain structure, the source or drain contact including an alloyed metal barrier layer and an inner conductive structure.

20 Claims, 10 Drawing Sheets

(51) Int. Cl.
 H01L 29/06 (2006.01)
 H01L 29/08 (2006.01)
 H01L 29/417 (2006.01)
 H01L 29/423 (2006.01)
 H01L 29/66 (2006.01)
 H01L 29/78 (2006.01)
 H01L 29/786 (2006.01)
 H10D 30/01 (2025.01)
 H10D 30/62 (2025.01)
 H10D 30/67 (2025.01)
 H10D 62/10 (2025.01)
 H10D 62/13 (2025.01)
 H10D 64/01 (2025.01)
 H10D 64/62 (2025.01)

(52) U.S. Cl.
 CPC ....... *H10D 30/031* (2025.01); *H10D 30/6211* (2025.01); *H10D 30/6713* (2025.01); *H10D 30/6729* (2025.01); *H10D 30/6735* (2025.01); *H10D 30/6757* (2025.01); *H10D 62/121* (2025.01); *H10D 62/151* (2025.01); *H10D 64/017* (2025.01)

(58) Field of Classification Search
 CPC ............... H01L 21/845; H01L 27/0886; H01L 27/0924; H01L 27/1211; H01L 29/0665; H01L 29/0669; H01L 29/0673; H01L 29/0847; H01L 29/41733; H01L 29/41791; H01L 29/42392; H01L 29/45; H01L 29/66439; H01L 29/66545; H01L 29/66742; H01L 29/66795; H01L 29/775; H01L 29/785; H01L 29/7851; H01L 29/7853; H01L 29/7855; H01L 29/78618; H01L 29/78696; H01L 2029/7858
 See application file for complete search history.

(56) References Cited

U.S. PATENT DOCUMENTS

| 2012/0262659 | A1* | 10/2012 | Takasawa | G02F 1/136286 |
| | | | | 174/257 |
| 2016/0307890 | A1 | 10/2016 | Yeo | |
| 2018/0130886 | A1 | 5/2018 | Kim | |
| 2018/0315647 | A1* | 11/2018 | Wang | H01L 21/76864 |
| 2020/0411374 | A1* | 12/2020 | Huang | H01L 21/76829 |
| 2021/0104512 | A1* | 4/2021 | Mitra | H01L 27/0262 |
| 2021/0104612 | A1* | 4/2021 | Bae | H01L 21/823821 |

* cited by examiner

LOW RESISTANCE AND REDUCED REACTIVITY APPROACHES FOR FABRICATING CONTACTS AND THE RESULTING STRUCTURES

TECHNICAL FIELD

Embodiments of the disclosure are in the field of integrated circuit structures and, in particular, low resistance and reduced reactivity approaches for fabricating contacts, and semiconductor structures having low resistance metal contacts.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
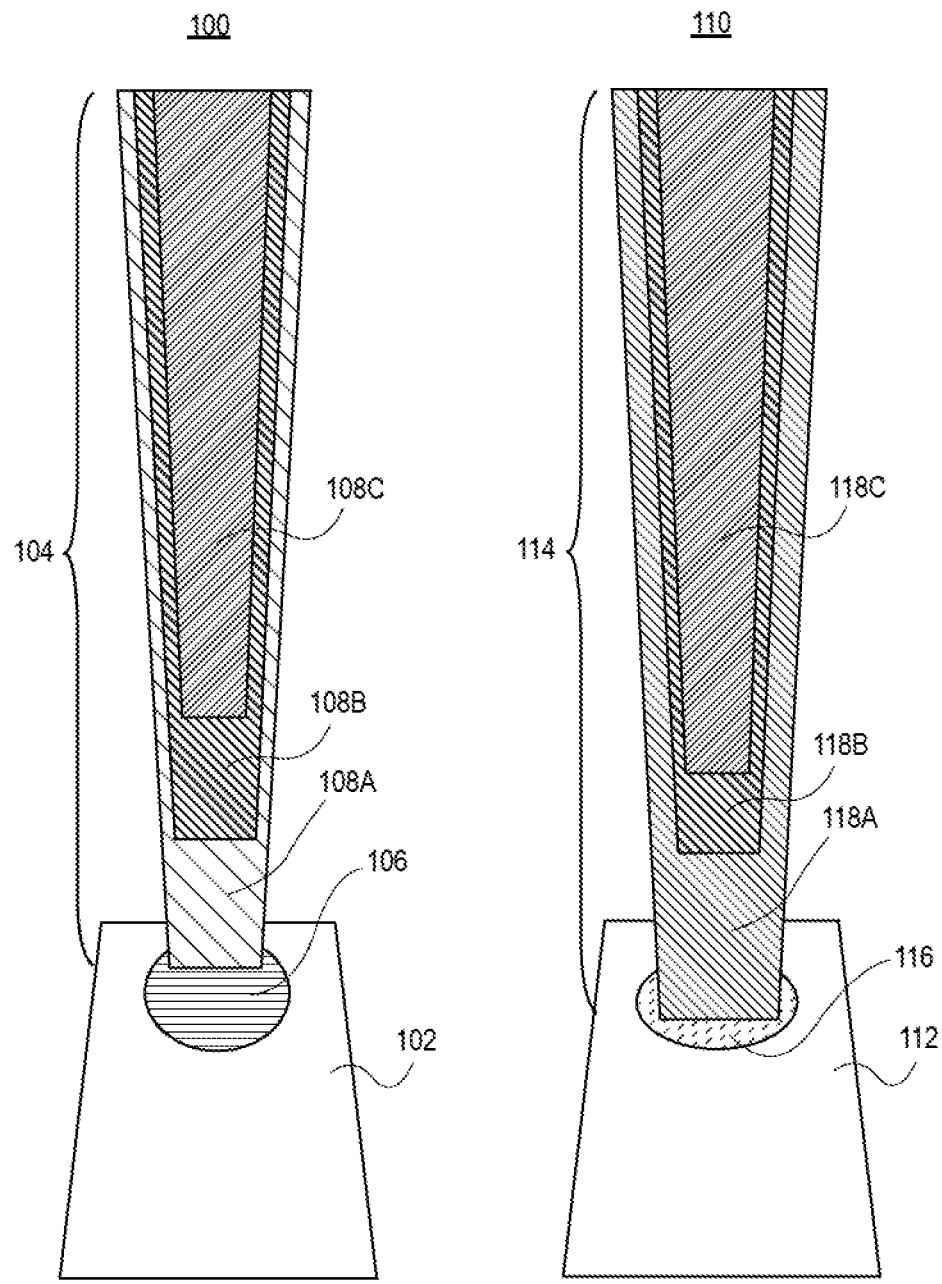
FIG. 1A illustrates cross-sectional views of a metal-semiconductor contact structure without and with an alloyed metal barrier layer, in accordance with an embodiment of the present disclosure.

Low resistance and reduced reactivity approaches for fabricating contacts, and integrated circuit structure including semiconductor structures having low resistance metal contacts, are described. In the following description, numerous specific details are set forth, such as specific material and device architecture regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to low resistance and low reactivity contacts by inclusion of an alloyed metal barrier at a metal-semiconductor interface. One or more embodiments described herein are directed to alloyed metal contacts for reduced reactivity and lower metal-semiconductor barrier height at contact. One or more embodiments described herein are directed to achieving lower metal-to-semiconductor contact resistivity by introducing alloyed metal contacts in a trench contact (TCN) contact trench.

To provide context, state-of-the-art contact structures include Ti metal in contact with highly doped epi in the source and drain of a transistor. Titanium (Ti) in contact with the epi forms a TiSi and is used for both NMOS and PMOS contacts. One benefit is that a single metal silicide that is reactive can be used for both n and pMOS contacts since he silicide pins at the mid-gap energy level in the semiconductor band gap. However, there is no known solution that does not result in significant silicide formation. To that end, silicide formation from Ti or Ni contacts can consume 2-6 nanometers of highly doped silicon and would negate any scaling benefit. Additionally, such silicides can be associated with large metal-semiconductor barrier heights, and may be a relatively thick silicide that can eventually limit contact width scaling.

In accordance with one or more embodiments of the present disclosure, an alloyed metal is used in a transistor source or drain contact to enable more band edge metal solutions that have a lower metal-semiconductor barrier height. Advantages of implementing embodiments described herein can include one or more of (1) a lower barrier height increases current out of the transistor, (2) a more stable alloyed metal in the contact can provide less variation with downstream processing, and/or (3) a more stable metal-semiconductor interface can result in thinner silicide/germanide and can enable contact trench scaling and thus greater transistor density.

In an aspect, reduced reactivity of metal contacts by alloyed metals in contact trench is achieved by inclusion of alloyed metal barrier layer at the metal-semiconductor interface. In embodiment, there is minimal or no silicide, or at least a reduced silicide region, at the contact interface, enabling contact scaling. In an embodiment, there is less diffusion of Ti when Ti is alloyed with aluminum. In an embodiment, there is less diffusion of Mg when Mg is alloyed with Al. Thus, alloys have been demonstrated to be relatively more stable. In an embodiment, the increased stability leads to less silicide formations as a result of a contact "metal" or "barrier" having reduced reactivity.

As a comparative example, FIG. 1A illustrates cross-sectional views of a metal-semiconductor contact structure without and with an alloyed metal barrier layer, in accordance with an embodiment of the present disclosure.

Referring to structure 100 of FIG. 1A, a state-of-the-art metal-semiconductor contact structure 100 includes a conductive contact 104 on or within a recess of a semiconductor structure 102, such as a N++ doped semiconductor structure. The conductive contact 104 includes a titanium layer 108A (such as a layer composed of 98% or greater of titanium), a titanium nitride layer 108B, and a conductive fill 108C (such as a fill material including Cu, Al, W, Co, or alloys thereof). A metal silicide region 106, such as a titanium silicide region 106, is between the conductive contact 104 and the semiconductor structure 102.

By contrast to structure 100 of FIG. 1A, referring to structure 110 of FIG. 1A, in accordance with an embodiment of the present disclosure, a metal-semiconductor contact structure 110 includes a conductive contact 114 on or within a recess of a semiconductor structure 112, such as a N++ doped semiconductor structure. The conductive contact 114 includes an alloyed metal barrier layer 118A, a titanium nitride layer 118B, and a conductive fill 118C (such as a fill material including Cu, Al, W, Co, or alloys thereof). In an embodiment, there is little to no metal silicide region, or at least a relatively reduced silicide region 116, between the conductive contact 114 and the semiconductor structure 112, as is depicted.

In an embodiment, the alloyed metal barrier layer 118A is composed of a metal alloy including titanium and a metal or combination of metals such as, but not limited to, aluminum (e.g., to form TiAl), magnesium and aluminum (e.g., to form MgTiAl), tungsten (e.g., to form TiW), or hafnium and aluminum (e.g., to form HfAlTi). In an embodiment, the alloyed metal barrier layer 118A is composed of a metal alloy including aluminum and a metal or combination of metals such as, but not limited to, magnesium (e.g., to form MgAl), zirconium (e.g., to form ZrAl), tantalum and magnesium (e.g., to form TaAlMg), or hafnium (e.g., to form HfAl). In an embodiment, the alloyed metal barrier layer 118A has a thickness in a range of 0.5 nanometers to 5 nanometers.

In an embodiment, to the extent that there is a metal silicide region, such a metal silicide region 116 includes a metal from the alloyed metal barrier layer and silicon from the first or second semiconductor source or drain structure. In one such embodiment, the metal silicide region 116 further includes germanium from the first or second semiconductor source or drain structure.

Figure 1B:
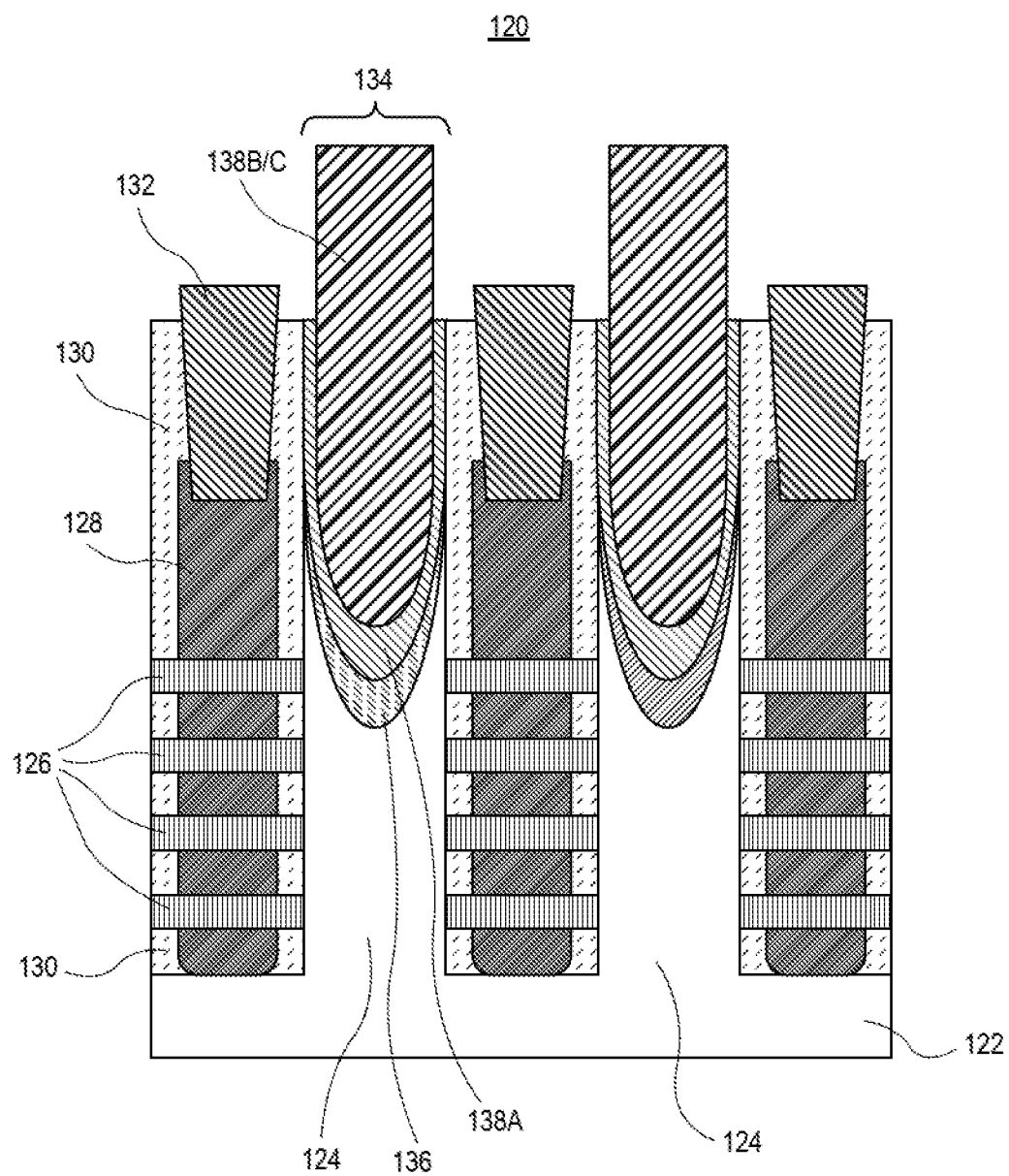
FIG. 1B illustrates a cross-sectional view of a semiconductor structure including metal-semiconductor contacts without an alloyed metal barrier layer.

As a comparative example of a nanowire or nanoribbon conductive contact structure, FIG. 1B illustrates a cross-sectional view of a state-of-the-art integrated circuit structure including metal-semiconductor contacts without an alloyed metal barrier layer.

Referring to FIG. 1B, an integrated circuit structure 120 includes a substrate 122, such as a silicon substrate or silicon sub-fin structure. Epitaxial source or drain structures 124, such as highly doped N-type epitaxial source or drain structures, are on the substrate 122. A plurality of nanowires or nanoribbons 126, such as silicon nanowires or nanoribbons, are above the substrate 122 and coupled to the epitaxial source or drain structures 124. Gate stacks 128, each of which can include a gate dielectric and gate electrode, is over and surrounds channel regions of the plurality of nanowires or nanoribbons 126. A gate dielectric spacer 130 is on sides of each gate stack 128. A gate contact 132 is on each of the gate stacks 128. A source or drain contact 134 is on a corresponding one of the epitaxial source or drain structures 124. The source or drain contact 134 includes a titanium layer 138A (such as a layer composed of 98% or greater of titanium), and an inner conductive structure 138B/C which can include a titanium nitride layer and a conductive fill (such as a fill material including Cu, Al, W, Co, or alloys thereof). A metal silicide region 136, such as a titanium silicide region 136, is between the conductive contact 134 and the corresponding one of the epitaxial source or drain structures 124.

Figure 1C:
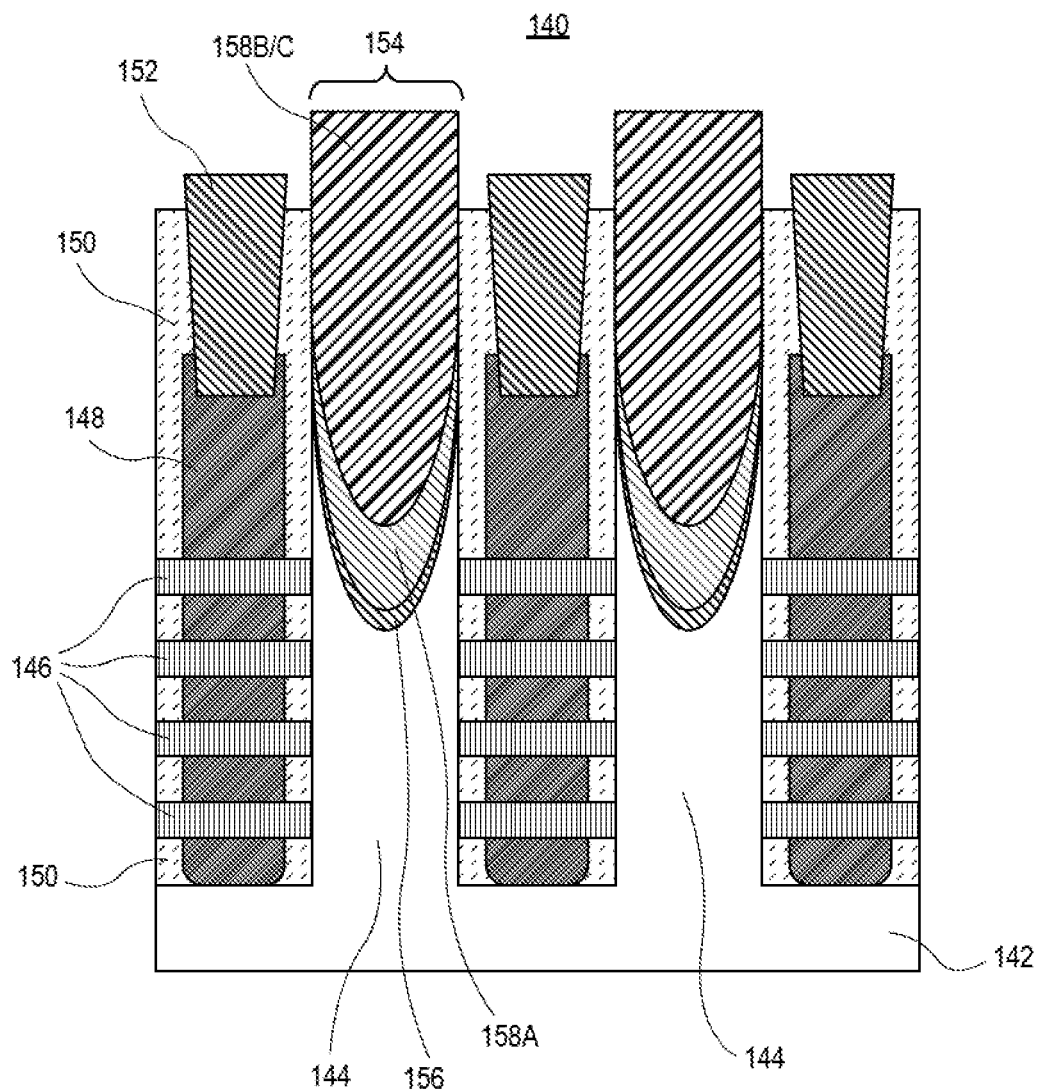
FIG. 1C illustrates a cross-sectional view of an integrated circuit structure including metal-semiconductor contacts with an alloyed metal barrier layer, in accordance with an embodiment of the present disclosure.

By contrast to FIG. 1B, FIG. 1C illustrates a cross-sectional view of an integrated circuit structure including metal-semiconductor contacts with an alloyed metal barrier layer, in accordance with an embodiment of the present disclosure.

Referring to FIG. 1C, an integrated circuit structure 140 includes a substrate 142, such as a silicon substrate or silicon sub-fin structure. Epitaxial source or drain structures 144, such as highly doped N-type epitaxial source or drain structures, are on the substrate 142. A plurality of nanowires or nanoribbons 146, such as silicon or silicon germanium nanowires or nanoribbons, are above the substrate 142 and coupled to the epitaxial source or drain structures 144. Gate stacks 148, each of which can include a gate dielectric and gate electrode, is over and surrounds channel regions of the plurality of nanowires or nanoribbons 146. A gate dielectric spacer 150 is on sides of each gate stack 148. A gate contact 152 is on each of the gate stacks 148. A source or drain contact 154 is on a corresponding one of the epitaxial source or drain structures 144. The source or drain contact 154 includes an alloyed metal barrier layer 158A, and an inner conductive structure 158B/C which can include a titanium nitride layer and a conductive fill (such as a fill material including Cu, Al, W, Co, or alloys thereof). In an embodiment, there is little to no metal silicide region, or at least a relatively reduced silicide region 156, between the source or drain contact 154 and the corresponding one of the epitaxial source or drain structures 144, as is depicted.

In an embodiment, the alloyed metal barrier layer 158A is composed of a metal alloy including titanium and a metal or combination of metals such as, but not limited to, aluminum (e.g., to form TiAl), magnesium and aluminum (e.g., to form MgTiAl), tungsten (e.g., to form TiW), or hafnium and aluminum (e.g., to form HfAlTi). In an embodiment, the alloyed metal barrier layer 158A is composed of a metal alloy including aluminum and a metal or combination of metals such as, but not limited to, magnesium (e.g., to form MgAl), zirconium (e.g., to form ZrAl), tantalum and magnesium (e.g., to form TaAlMg), or hafnium (e.g., to form HfAl). In an embodiment, the alloyed metal barrier layer 158A has a thickness in a range of 0.5 nanometers to 5 nanometers.

In an embodiment, to the extent that there is a metal silicide region, such a metal silicide region includes a metal from the alloyed metal barrier layer and silicon from the first or second semiconductor source or drain structure. In one such embodiment, the metal silicide region further includes germanium from the first or second semiconductor source or drain structure.

It is to be appreciated that, in a particular embodiment, a nanowire or nanoribbon may be composed of silicon. As used throughout, a silicon layer may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer may include a silicon layer that contains a relatively small amount, e.g., "impurity" level, non-Si atoms or species, such as Ge, C or Sn. It is to be appreciated that a silicon layer as described herein may be undoped or may be doped with dopant atoms such as boron, phosphorous or arsenic.

It is to be appreciated that, in another particular embodiment, a nanowire or nanoribbon may be may be composed of silicon germanium. As used throughout, a silicon germanium layer may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 60% germanium and approximately 40% silicon ($Si_{40}Ge_{60}$). In other embodiments, the amount of silicon is greater than the amount of germanium. In particular embodiments, a silicon germanium layer includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer may include a silicon germanium layer that contains a relatively small amount, e.g., "impurity" level, non-Ge and non-Si atoms or species, such as carbon or tin. It is to be appreciated that a silicon germanium layer as described herein may be undoped or may be doped with dopant atoms such as boron, phosphorous or arsenic.

It is also to be appreciated that the embodiments described herein can also include other implementations such as nanowires and/or nanoribbons with various widths, thicknesses and/or materials including but not limited to Si or SiGe. For example, Ge or group III-V materials may be used as channel materials.

Figure 2A:
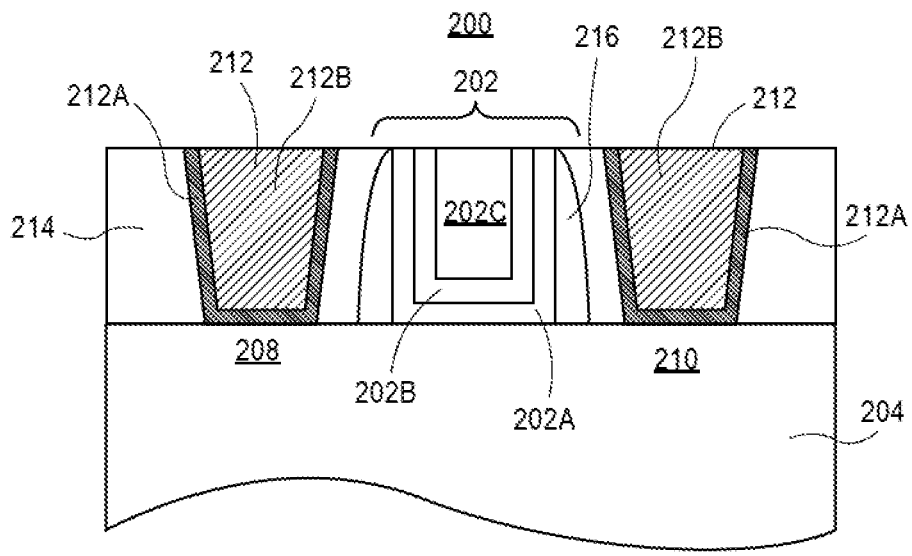
FIG. 2A illustrates a cross-sectional view of a semiconductor device having a conductive contact on a source or drain region, in accordance with an embodiment of the present disclosure.

In another, more general, aspect, FIG. 2A illustrates a cross-sectional view of a semiconductor device having a conductive contact on a source or drain region, in accordance with an embodiment of the present disclosure.

Referring to FIG. 2A, a semiconductor structure 200 includes a gate structure 202 above a substrate 204. The gate structure 202 includes a gate dielectric layer 202A, a workfunction layer 202B, and a gate fill 202C. A source region 208 and a drain region 210 are on opposite sides of the gate structure 202. Source or drain contacts 212 are electrically connected to the source region 208 and the drain region 210, and are spaced apart of the gate structure 202 by one or both of an inter-layer dielectric layer 214 or gate dielectric spacers 216. The source region 208 and the drain region 210 are regions of the substrate 204.

In an embodiment, the source or drain contacts 212 each include an alloyed metal barrier layer 212A and an inner conductive structure 212B which can include a titanium nitride layer, and a conductive fill (such as a fill material including Cu, Al, W, Co, or alloys thereof), such as described in association with FIGS. 1A-1C. In an embodiment, there is little to no metal silicide region, or at least a relatively reduced silicide region, between the source or drain contacts 212 and the corresponding one of the source region 208 or drain region 210.

In an embodiment, the alloyed metal barrier layer 212A is composed of a metal alloy including titanium and a metal or combination of metals such as, but not limited to, aluminum (e.g., to form TiAl), magnesium and aluminum (e.g., to form MgTiAl), tungsten (e.g., to form TiW), or hafnium and aluminum (e.g., to form HfAlTi). In an embodiment, the alloyed metal barrier layer 212A is composed of a metal alloy including aluminum and a metal or combination of metals such as, but not limited to, magnesium (e.g., to form MgAl), zirconium (e.g., to form ZrAl), tantalum and magnesium (e.g., to form TaAlMg), or hafnium (e.g., to form HfAl). In an embodiment, the alloyed metal barrier layer 212A has a thickness in a range of 0.5 nanometers to 5 nanometers.

In an embodiment, to the extent that there is a metal silicide region, such a metal silicide region includes a metal from the alloyed metal barrier layer and silicon from the first or second semiconductor source or drain structure. In one such embodiment, the metal silicide region further includes germanium from the first or second semiconductor source or drain structure.

Figure 2B:
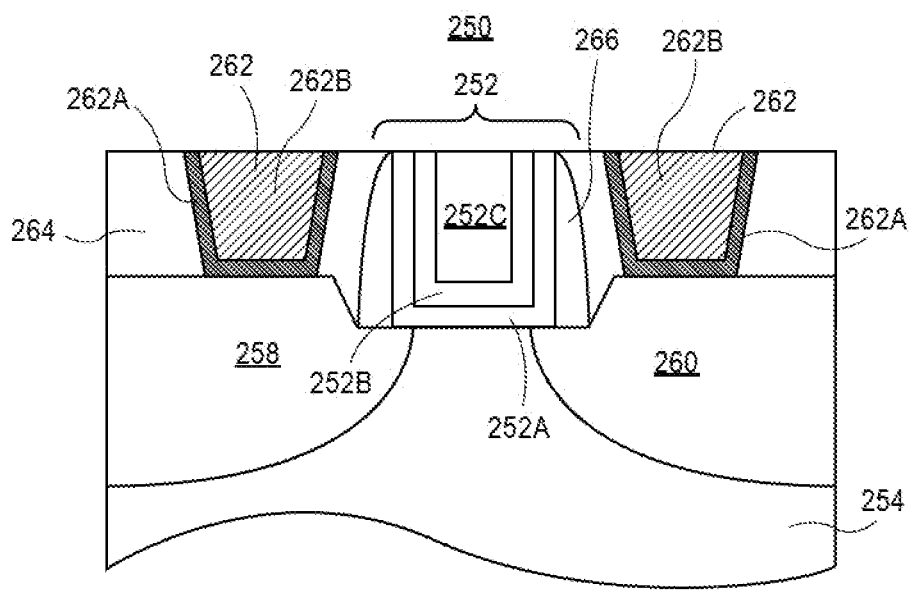
FIG. 2B illustrates a cross-sectional view of another semiconductor device having a conductive on a raised source or drain region, in accordance with an embodiment of the present disclosure.

FIG. 2B illustrates a cross-sectional view of another semiconductor device having a conductive on a raised source or drain region, in accordance with an embodiment of the present disclosure.

Referring to FIG. 2B, a semiconductor structure 250 includes a gate structure 252 above a substrate 254. The gate structure 252 includes a gate dielectric layer 252A, a workfunction layer 252B, and a gate fill 252C. A source region 258 and a drain region 260 are on opposite sides of the gate structure 252. Source or drain contacts 262 are electrically connected to the source region 258 and the drain region 260, and are spaced apart of the gate structure 252 by one or both of an inter-layer dielectric layer 264 or gate dielectric spacers 266. The source region 258 and the drain region 260 are epitaxial and/or embedded material regions formed in etched-out regions of the substrate 254. As is depicted, in an embodiment, the source region 258 and the drain region 260 are raised source and drain regions. In a specific such embodiment, the raised source and drain regions are raised silicon source and drain regions or raised silicon germanium source and drain regions.

In an embodiment, the source or drain contacts 262 each include an alloyed metal barrier layer 262A and an inner conductive structure 262B which can include a titanium nitride layer, and a conductive fill (such as a fill material including Cu, Al, W, Co, or alloys thereof), such as described in association with FIGS. 1A-1C. In an embodiment, there is little to no metal silicide region, or at least a relatively reduced silicide region, between the source or drain contacts 262 and the corresponding one of the source region 258 or drain region 260.

In an embodiment, the alloyed metal barrier layer 262A is composed of a metal alloy including titanium and a metal or combination of metals such as, but not limited to, aluminum (e.g., to form TiAl), magnesium and aluminum (e.g., to form MgTiAl), tungsten (e.g., to form TiW), or hafnium and aluminum (e.g., to form HfAlTi). In an embodiment, the alloyed metal barrier layer 262A is composed of a metal alloy including aluminum and a metal or combination of metals such as, but not limited to, magnesium (e.g., to form MgAl), zirconium (e.g., to form ZrAl), tantalum and magnesium (e.g., to form TaAlMg), or hafnium (e.g., to form HfAl). In an embodiment, the alloyed metal barrier layer 262A has a thickness in a range of 0.5 nanometers to 5 nanometers.

In an embodiment, to the extent that there is a metal silicide region, such a metal silicide region includes a metal from the alloyed metal barrier layer and silicon from the first or second semiconductor source or drain structure. In one such embodiment, the metal silicide region further includes germanium from the first or second semiconductor source or drain structure.

Figure 3:
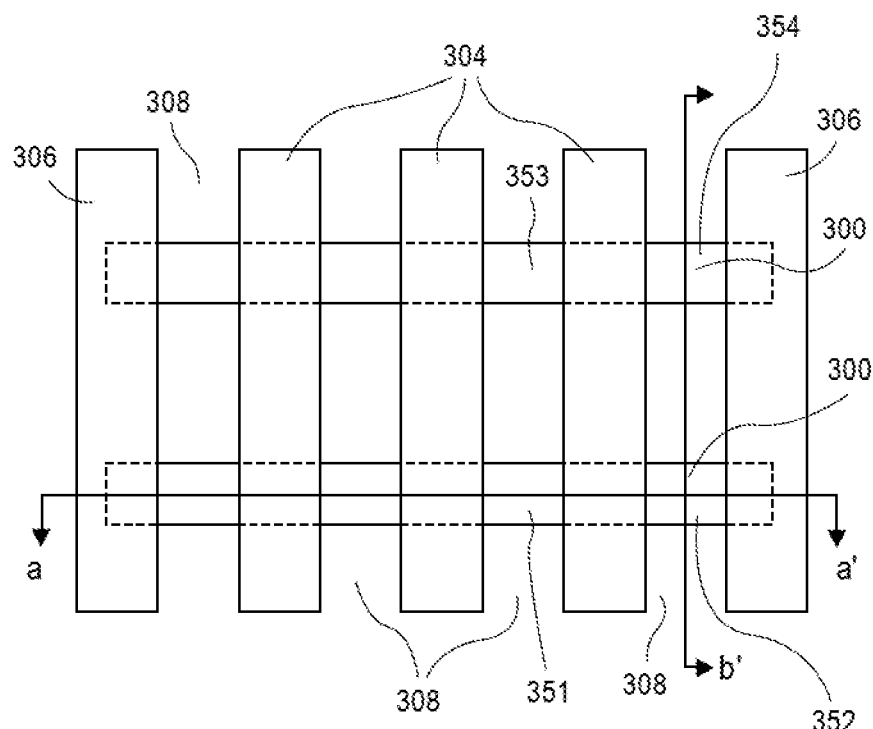
FIG. 3 illustrates a plan view of a plurality of gate lines over a pair of semiconductor fins, in accordance with an embodiment of the present disclosure.

In another aspect, FIG. 3 illustrates a plan view of a plurality of gate lines over a pair of semiconductor fins, in accordance with an embodiment of the present disclosure.

Referring to FIG. 3, a plurality of active gate lines 304 is formed over a plurality of semiconductor fins 300. Dummy gate lines 306 are at the ends of the plurality of semiconductor fins 300. Spacings 308 between the gate lines 304/306 are locations where trench contacts may be formed as conductive contacts to source or drain regions, such as source or drain regions 351, 352, 353, and 354.

In an embodiment, the pattern of the plurality of gate lines 304/306 and/or the pattern of the plurality of semiconductor fins 300 is described as a grating structure. In an embodiment, the term "grating" for the plurality of gate lines 304/306 and/or the pattern of the plurality of semiconductor fins 300 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have the plurality of gate lines 304/306 and/or the pattern of the plurality of semiconductor fins 300 spaced at a constant pitch and having a constant width. The pattern may be fabricated by a pitch halving or pitch quartering, or other pitch division, approach.

Figure 4A:
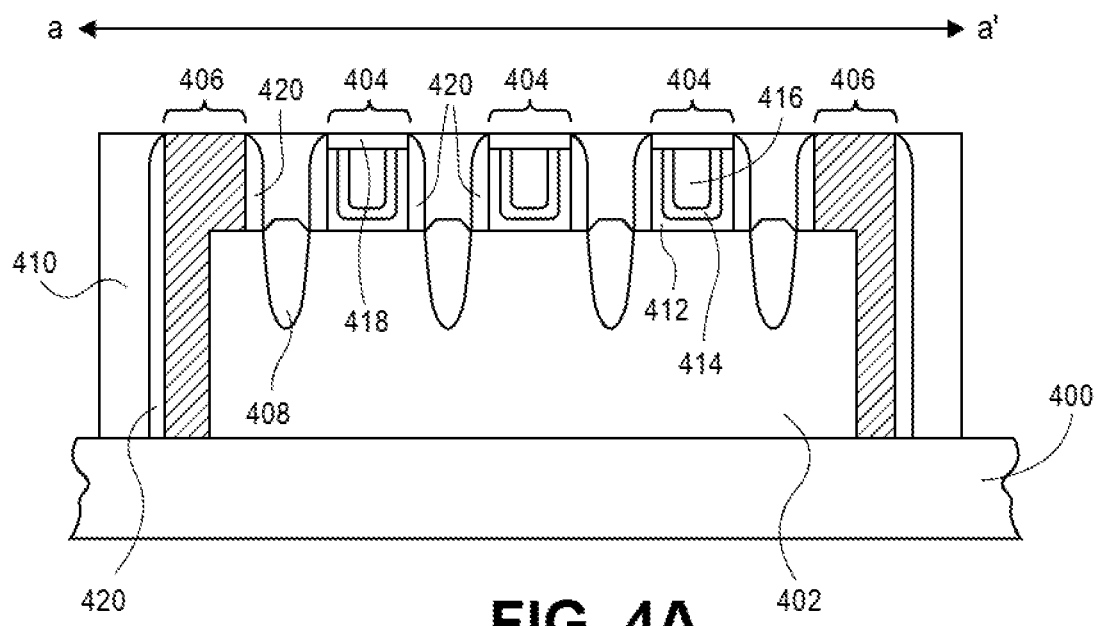
FIGS. 4A-4C illustrate cross-sectional views, taken along the a-a' axis of FIG. 3, for various operations in a method of fabricating an integrated circuit structure, in accordance with an embodiment of the present disclosure.
Figure 4B:
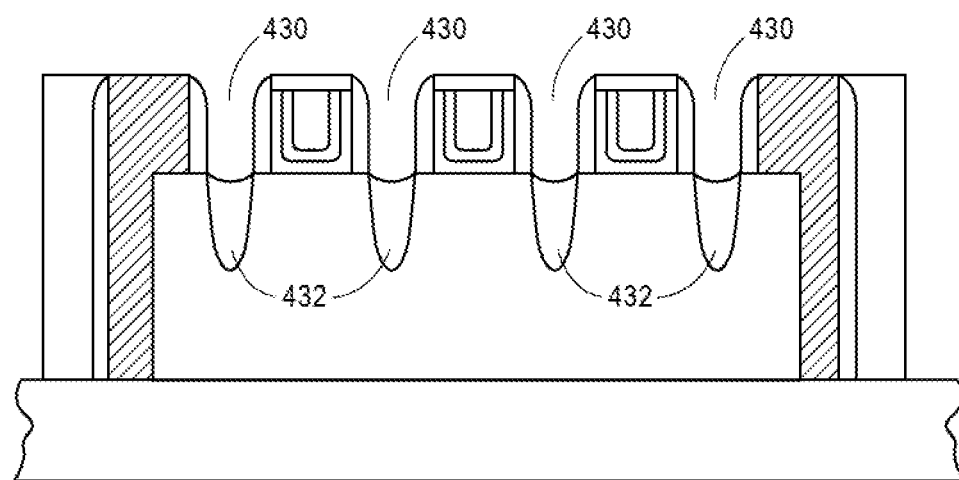
Figure 4C:
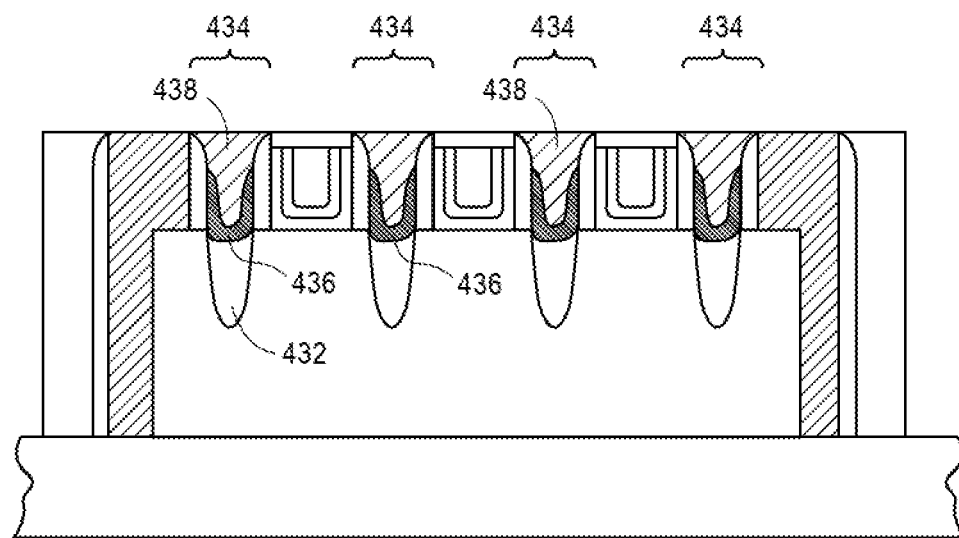

FIGS. 4A-4C illustrate cross-sectional views, taken along the a-a' axis of FIG. 3, for various operations in a method of fabricating an integrated circuit structure, in accordance with an embodiment of the present disclosure.

Referring to FIG. 4A, a plurality of active gate lines 404 is formed over a semiconductor fin 402 formed above a substrate 400. Dummy gate lines 406 are at the ends of the semiconductor fin 402. A dielectric layer 410 is between the active gate lines 404, between the dummy gate lines 406 and the active gate lines 404, and outside of the dummy gate lines 406. Embedded source or drain structures 408 are in the semiconductor fin 402 between the active gate lines 404 and between the dummy gate lines 406 and the active gate lines 404. The active gate lines 404 include a gate dielectric layer 412, a workfunction gate electrode portion 414 and a fill gate electrode portion 416, and a dielectric capping layer 418. Dielectric spacers 420 line the sidewalls of the active gate lines 404 and the dummy gate lines 406.

Referring to FIG. 4B, the portion of the dielectric layer 410 between the active gate lines 404 and between the dummy gate lines 406 and the active gate lines 404 is removed to provide openings 430 in locations where trench contacts are to be formed. Removal of the portion of the dielectric layer 410 between the active gate lines 404 and between the dummy gate lines 406 and the active gate lines 404 may lead to erosion of the embedded source or drain structures 408 to provide eroded embedded source or drain structures 432 which may have an upper saddle-shaped topography, as is depicted in FIG. 4B.

Referring to FIG. 4C, trench contacts 434 are formed in openings 430 between the active gate lines 404 and between the dummy gate lines 406 and the active gate lines 404. Each of the trench contacts 434 may include an alloyed metal barrier layer 436, and an inner conductive structure 438 which can include a titanium nitride layer, and a conductive fill (such as a fill material including Cu, Al, W, Co, or alloys thereof), such as described in association with FIGS. 1A-1C. In an embodiment, there is little to no metal silicide region, or at least a relatively reduced silicide region, between the trench contacts 434 and the corresponding one of the eroded embedded source or drain structures 432.

In an embodiment, the alloyed metal barrier layer 436 is composed of a metal alloy including titanium and a metal or combination of metals such as, but not limited to, aluminum (e.g., to form TiAl), magnesium and aluminum (e.g., to form MgTiAl), tungsten (e.g., to form TiW), or hafnium and aluminum (e.g., to form HfAlTi). In an embodiment, the alloyed metal barrier layer 436 is composed of a metal alloy including aluminum and a metal or combination of metals such as, but not limited to, magnesium (e.g., to form MgAl), zirconium (e.g., to form ZrAl), tantalum and magnesium (e.g., to form TaAlMg), or hafnium (e.g., to form HfAl). In an embodiment, the alloyed metal barrier layer 436 has a thickness in a range of 0.5 nanometers to 5 nanometers.

In an embodiment, to the extent that there is a metal silicide region, such a metal silicide region includes a metal from the alloyed metal barrier layer and silicon from the first or second semiconductor source or drain structure. In one such embodiment, the metal silicide region further includes germanium from the first or second semiconductor source or drain structure.

Figure 5:
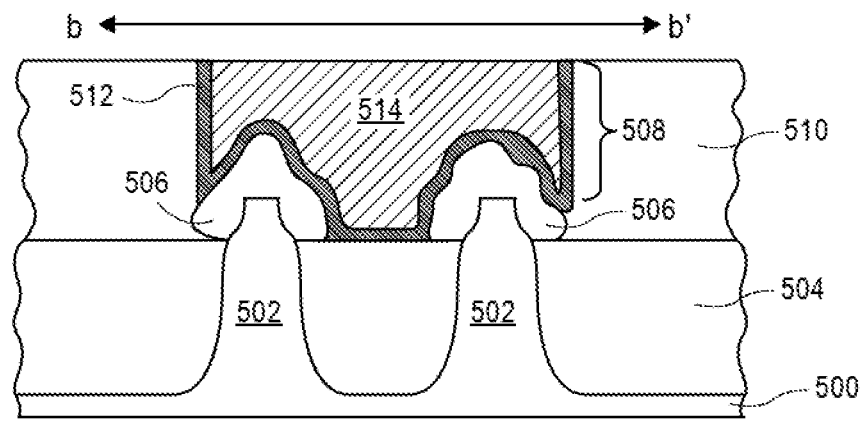
FIG. 5 illustrates a cross-sectional view, taken along the b-b' axis of FIG. 3, for an integrated circuit structure, in accordance with an embodiment of the present disclosure.

FIG. 5 illustrates a cross-sectional view, taken along the b-b' axis of FIG. 3, for an integrated circuit structure, in accordance with an embodiment of the present disclosure.

Referring to FIG. 5, fins 502 are depicted above a substrate 500. Lower portions of the fins 502 are surrounded by a trench isolation material 504. Upper portions of fins 502 have been removed to enable growth of embedded source and drain structures 506. A trench contact 508 is formed in an opening of a dielectric layer 510, the opening exposing the embedded source and drain structures 506. In an embodiment, the trench contact includes a barrier layer 512 and an inner conductive structure 514 which can include a titanium nitride layer, and a conductive fill (such as a fill material including Cu, Al, W, Co, or alloys thereof), such as described in association with FIGS. 1A-1C. It is to be appreciated that, in accordance with an embodiment, the barrier layer 512 extends to the top of the trench contact 508, as is depicted in FIG. 5. In another embodiment, however, the barrier layer 512 does not extend to the top of the trench contact 508 and is somewhat recessed within the trench contact 508, e.g., similar to the depiction of metallic contact layer 436 in FIG. 4C.

Figure 6:
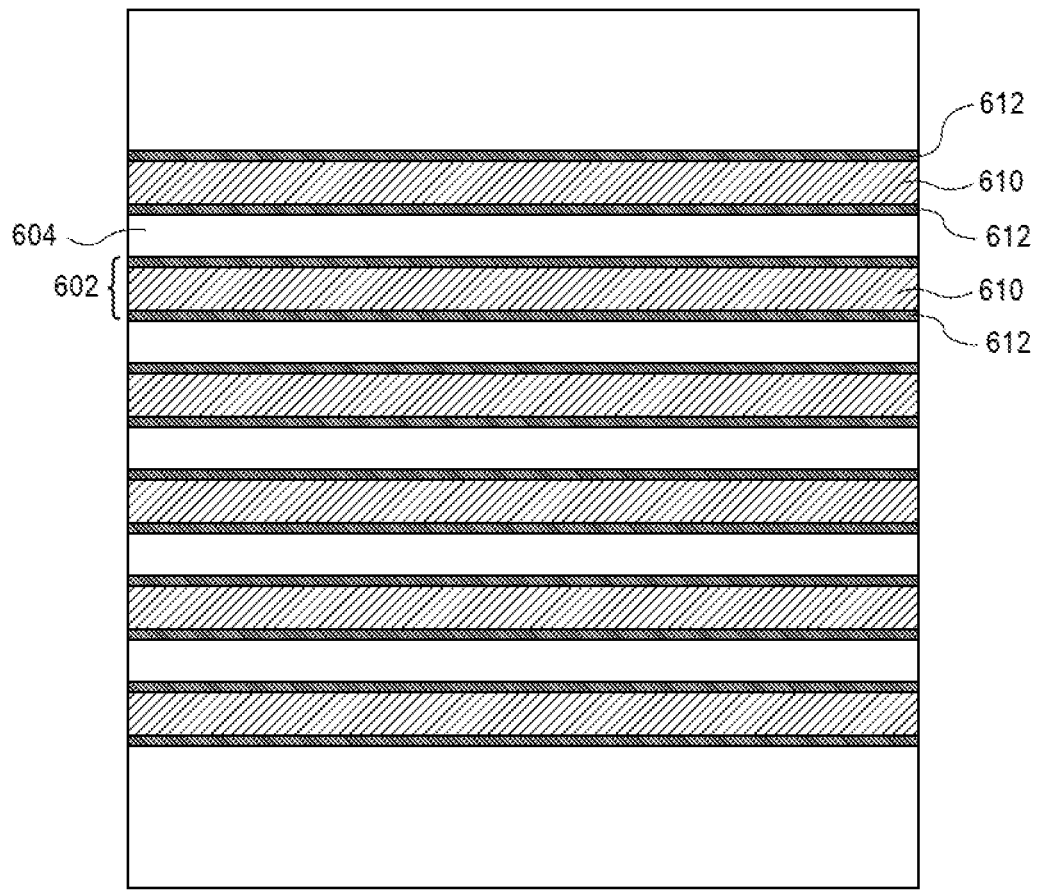
FIG. 6 illustrates a plan view and corresponding cross-sectional view of a metallization layer of an integrated circuit structure, in accordance with an embodiment of the present disclosure.
Figure 6:
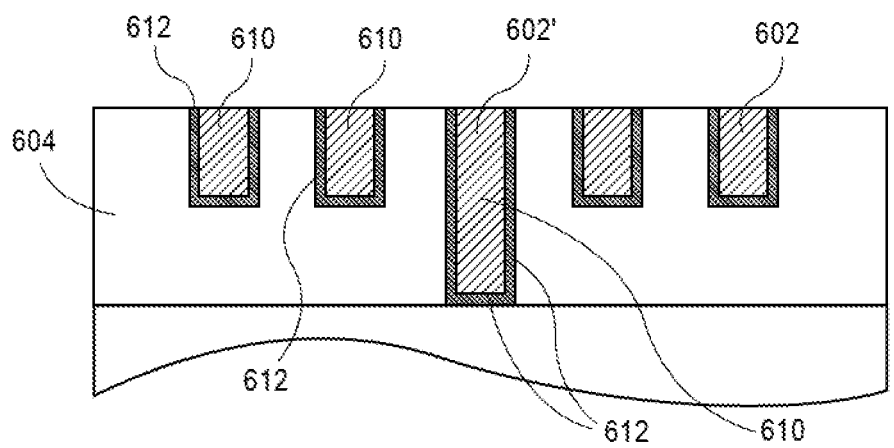

In another aspect, FIG. 6 illustrates a plan view and corresponding cross-sectional view of a metallization layer of an integrated circuit structure, in accordance with an embodiment of the present disclosure.

Referring to FIG. 6, a metallization layer 600 includes a pattern of conductive lines 602 and interlayer dielectric (ILD) lines 604. The metallization layer 600 may be patterned in a grating-like pattern with conductive lines 602 spaced at a constant pitch and having a constant width, as is depicted in FIG. 6. Although not shown, the conductive lines 602 may have interruptions (i.e., cuts or plugs) at various locations along the lines. Some of the conductive lines may be associated with underlying vias, such as line 602' shown as an example in the cross-sectional view.

In an embodiment, the term "grating" for conductive lines 602 and ILD lines 604 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines 602 and/or ILD lines 604 spaced at a constant pitch and having a constant width. The pattern may be fabricated by a pitch halving or pitch quartering, or other pitch division, approach.

In an embodiment, the conductive lines 602 (and, possibly, underlying via structures) are composed of one or more metal or other conductive structures. The conductive lines 602 are also sometimes referred to in the art as traces, wires, lines, metal, interconnect lines or simply interconnects. In a particular embodiment, each of the conductive lines 602 includes an alloyed metal barrier layer 612, and an inner conductive structure 610 which can include a titanium nitride layer and a conductive fill (such as a fill material including Cu, Al, W, Co, or alloys thereof), such as described in association with FIGS. 1A-1C.

In an embodiment, ILD lines 604 are composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

It is to be appreciated that the layers and materials described in association with FIG. 6 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, the structure depicted in FIG. 6 may be fabricated on underlying lower level back end of line (BEOL) interconnect layers.

Figure 7A:
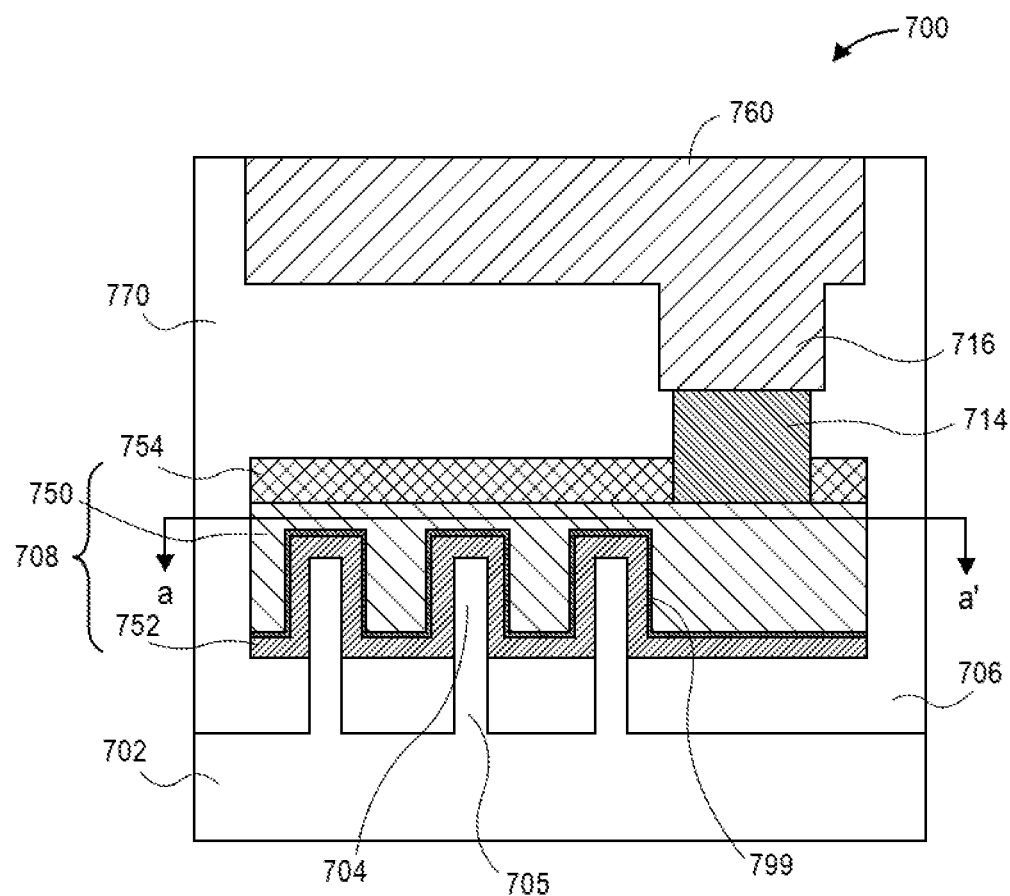
FIG. 7A illustrates a cross-sectional view of a non-planar semiconductor device, in accordance with an embodiment of the present disclosure.
Figure 7B:
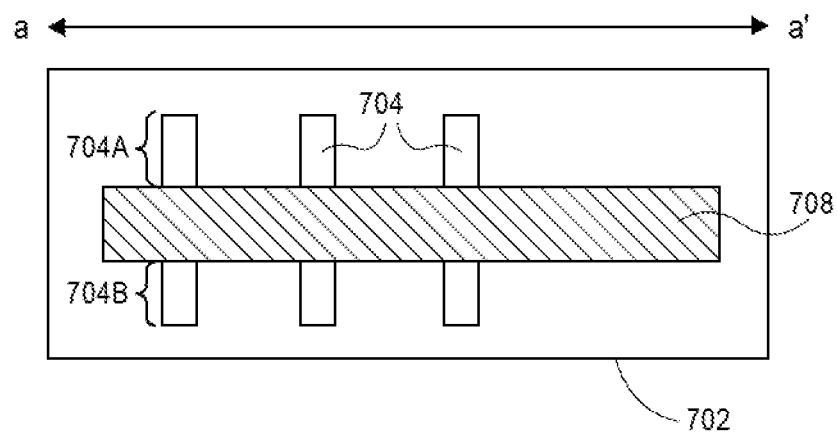
FIG. 7B illustrates a plan view taken along the a-a' axis of the semiconductor device of FIG. 7A, in accordance with an embodiment of the present disclosure.

One or more embodiments described herein are directed to fabricating semiconductor devices, such as for metal oxide semiconductor (MOS) device fabrication. As an example, FIG. 7A illustrates a cross-sectional view of a non-planar semiconductor device, in accordance with an embodiment of the present disclosure. FIG. 7B illustrates a plan view taken along the a-a' axis of the semiconductor device of FIG. 7A, in accordance with an embodiment of the present disclosure.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode 750/799 and a gate dielectric layer 752. In one embodiment, gate line 708 may also include a dielectric cap layer 754. A gate contact 714, and overlying gate contact via 716 are also seen from this perspective, along with an overlying metal interconnect 760, all of which are disposed in inter-layer dielectric stacks or layers 770. Also seen from the perspective of FIG. 7A, the gate contact 714 is, in one embodiment, disposed over isolation region 706, but not over the non-planar active regions.

In an embodiment, the gate contact 714 includes an alloyed metal barrier layer, and an inner conductive structure which can include a titanium nitride layer and a conductive fill (such as a fill material including Cu, Al, W, Co, or alloys thereof), such as described in association with FIGS. 1A-1C.

In accordance with an embodiment of the present disclosure, the layer 799 of gate electrode 750/799 is a P-type workfunction metal or an N-type workfunction metal, depending on whether the transistor is to be a PMOS or an NMOS transistor. In some implementations, the gate electrode layer 750 may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, tungsten and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of gate dielectric layer 752, i.e., into the sub-fin region 705.

In an embodiment, source and drain regions 704A and 704B have an associated source or drain contact that includes a barrier layer (such as a metal nitride or metal carbide barrier layer), and an inner conductive structure which can include a titanium layer (such as a layer composed of 98% or greater of titanium), a titanium nitride layer, and a conductive fill (such as a fill material including Cu, Al, W, Co, or alloys thereof), and may further include a non-selective epitaxial layer (such as a silicon or silicon germanium non-selective epitaxial layer), such as described in association with FIGS. 1A-1E.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode and gate electrode materials of gate lines 708 surround at least a top surface and a pair of sidewalls of the three-dimensional body.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, antimony, boron, gallium or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon monocrystalline substrate. Bulk substrate 702 may alternatively be composed of a group III-V material. In an embodiment, bulk substrate 702 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a group III-V material and the charge-carrier dopant impurity atoms are ones such as, but not limited to, magnesium, beryllium, zinc, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

In an embodiment, the gate dielectric layer 752 is composed of a high-k material. For example, in one embodiment, the gate dielectric layer 752 is composed of a material such as, but not limited to, hafnium oxide, hafnium oxynitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 702. In an embodiment, the gate dielectric layer is composed of a top high-k portion and a lower portion composed of an oxide of a semiconductor material. In one embodiment, the gate dielectric layer 752 is composed of a top portion of hafnium oxide and a bottom portion of silicon dioxide or silicon oxy-nitride.

In an embodiment, layer 750 of the gate electrode 750/799 is composed of a non-workfunction-setting conductive fill material formed above the workfunction-setting layer 799. In one such embodiment, the conductive fill material 750 includes a material such as but not limited to, tungsten (W), aluminum (Al), or copper (Cu). In one embodiment, one or more conductive barrier layers (such as titanium nitride or tantalum nitride) is between layers 750 and 799 of the gate electrode. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, the dielectric cap layer 754 and/or dielectric spacers associated with the gate electrode stacks may be composed of a material suitable to ultimately electrically isolate, or contribute to the isolation of, a permanent gate structure from adjacent or overlying conductive contacts, such as self-aligned contacts. For example, in one embodiment, the dielectric cap layer 754 and/or dielectric spacers are composed of a dielectric material such as, but not limited to, silicon dioxide, silicon oxy-nitride, silicon nitride, or carbon-doped silicon nitride.

Overlying gate contact via 716 and/or overlying metal interconnect 760 may be composed of a conductive material. In an embodiment, one or more of the contacts, interconnects or vias are composed of a metal species. The metal species may be a pure metal, such as tungsten, nickel, or cobalt, or may be an alloy such as a metal-metal alloy or a metal-semiconductor alloy (e.g., such as a silicide material). In a particular embodiment, one or more of overlying gate contact via 716, or overlying metal interconnect 760 includes a barrier layer and a conductive fill material. In one such embodiment, the barrier layer is a high purity metallic layer, such as described above. In an embodiment, the high purity metallic barrier layer has a total atomic composition including 98% or greater of titanium. In an embodiment, the total atomic composition of the high purity metallic barrier layer further includes 0.5-2% of chlorine. In an embodiment, the high purity metallic barrier layer has a thickness variation of 30% or less. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space in certain applications. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

In a particular embodiment, each of the trench contacts includes a barrier layer and a conductive fill material. In one such embodiment, the barrier layer is a high purity metallic layer, such as described above. In an embodiment, the high purity metallic barrier layer has a total atomic composition including 98% or greater of titanium. In an embodiment, the total atomic composition of the high purity metallic barrier layer further includes 0.5-2% of chlorine. In an embodiment, the high purity metallic barrier layer has a thickness variation of 30% or less. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
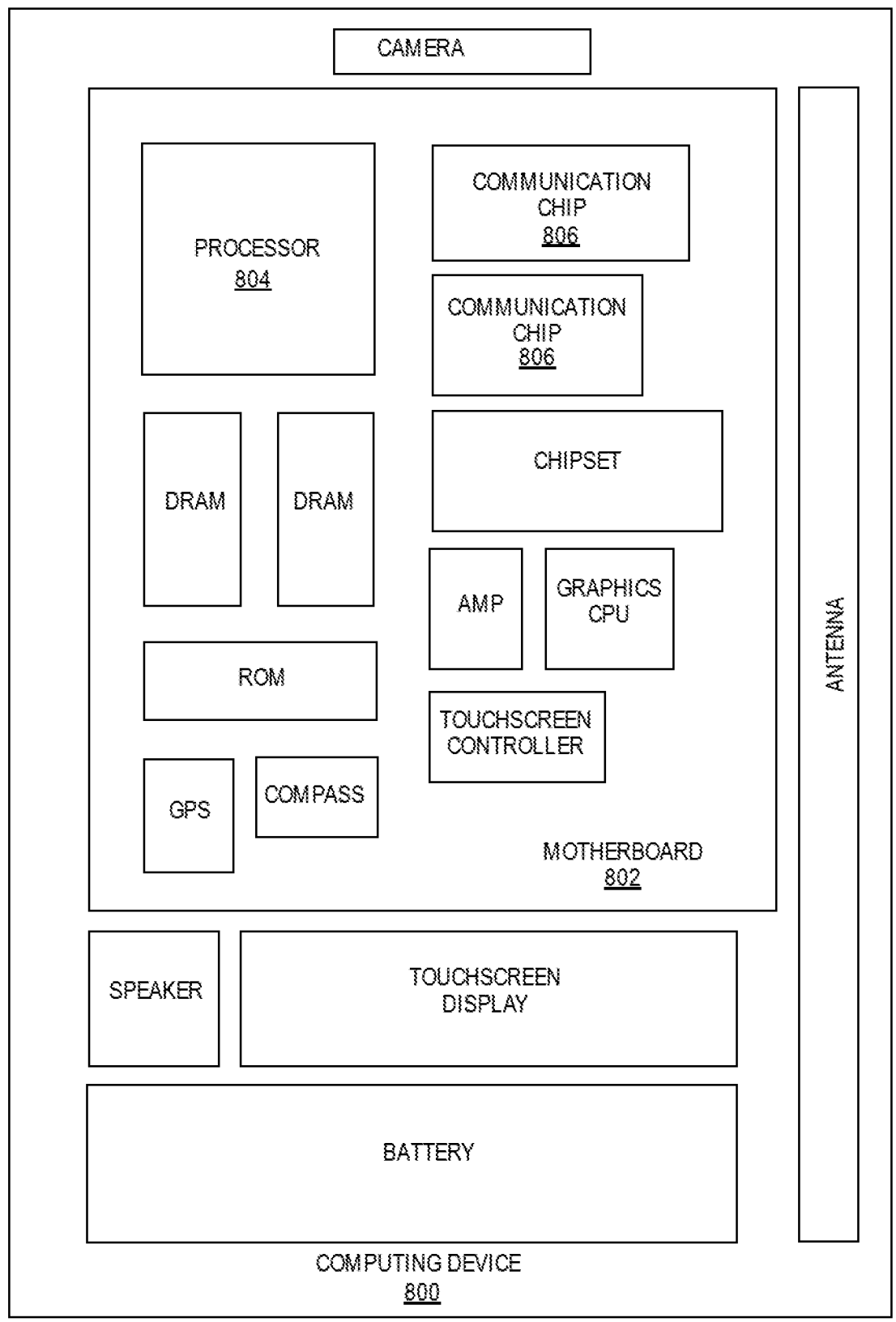
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touch-screen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more structures fabricated to include low resistance metal contacts, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more structures fabricated to include low resistance metal contacts, in accordance with implementations of embodiments of the disclosure.

In further implementations, another component housed within the computing device 800 may contain an integrated circuit die that includes one or more structures fabricated to include low resistance metal contacts, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
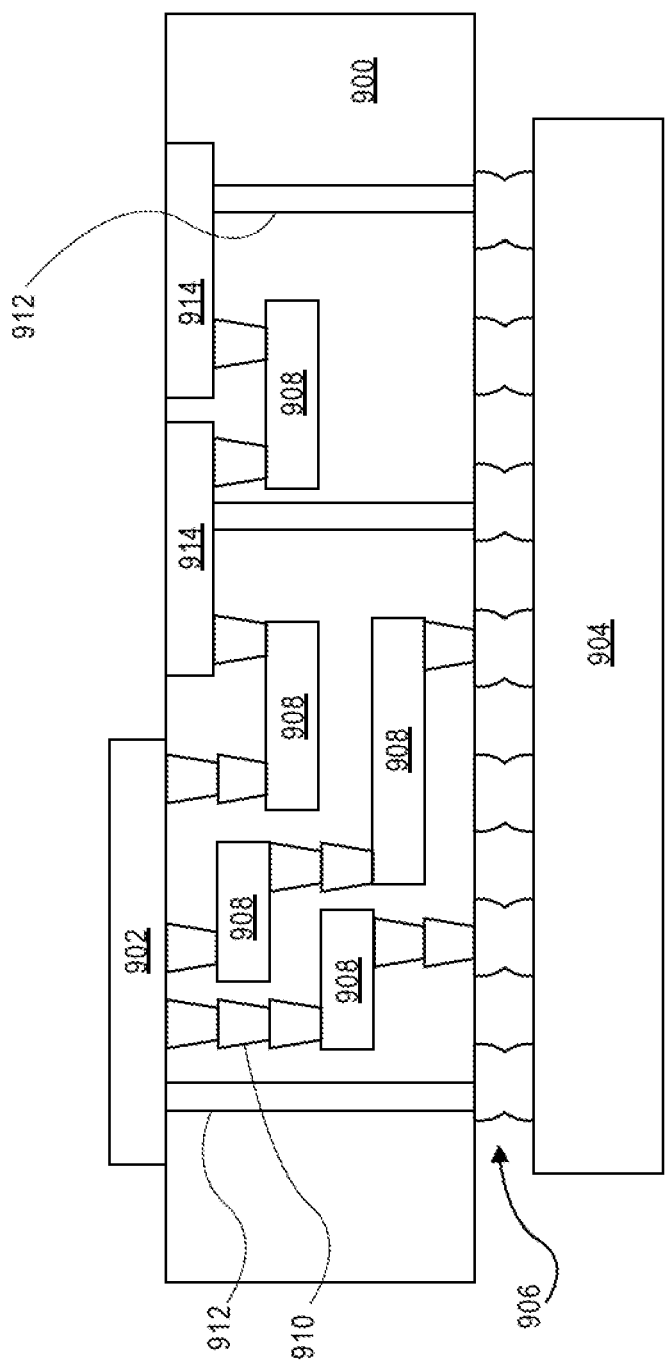
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900.

Thus, embodiments described herein include low resistance and reduced reactivity approaches for fabricating contacts, and semiconductor structures having low resistance metal contacts.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a semiconductor structure above a substrate. A gate electrode is over the semiconductor structure, the gate electrode defining a channel region in the semiconductor structure. A first semiconductor source or drain structure is at a first end of the channel region at a first side of the gate electrode. A second semiconductor source or drain structure is at a second end of the channel region at a second side of the gate electrode, the second end opposite the first end. A source or drain contact is on the first or second semiconductor source or drain structure, the source or drain contact including an alloyed metal barrier layer and an inner conductive structure.

Example embodiment 2: The integrated circuit structure of example embodiment 1, further including a metal silicide region between the source or drain contact and the first or second semiconductor source or drain structure, the metal silicide region including a metal from the alloyed metal barrier layer and silicon from the first or second semiconductor source or drain structure.

Example embodiment 3: The integrated circuit structure of example embodiment 2, wherein the metal silicide region further includes germanium from the first or second semiconductor source or drain structure.

Example embodiment 4: The integrated circuit structure of example embodiment 1, 2 or 3, wherein the alloyed metal barrier layer includes a metal alloy including titanium and a metal or combination of metals selected from the group consisting of aluminum, tungsten, magnesium and aluminum, and hafnium and aluminum.

Example embodiment 5: The integrated circuit structure of example embodiment 1, 2 or 3, wherein the alloyed metal barrier layer includes a metal alloy including aluminum and a metal or combination of selected from the group consisting of magnesium, zirconium, tantalum and magnesium, and hafnium.

Example embodiment 6: The integrated circuit structure of example embodiment 1, 2, 3, 4 or 5, wherein the alloyed metal barrier layer has a thickness in a range of 0.5 nanometers to 5 nanometers.

Example embodiment 7: The integrated circuit structure of example embodiment 1, 2, 3, 4, 5 or 6, wherein the inner conductive structure includes a titanium nitride layer, the titanium nitride layer on the alloyed metal barrier layer.

Example embodiment 8: A method of fabricating an integrated circuit structure includes forming a semiconductor structure above a substrate. The method also includes forming a gate electrode over the semiconductor structure, the gate electrode defining a channel region in the semiconductor structure. The method also includes forming a first semiconductor source or drain structure at a first end of the channel region at a first side of the gate electrode. The method also includes forming a second semiconductor source or drain structure at a second end of the channel region at a second side of the gate electrode, the second end opposite the first end. The method also includes forming a source or drain contact on the first or second semiconductor source or drain structure, the source or drain contact including an alloyed metal barrier layer and an inner conductive structure.

Example embodiment 9: The method of example embodiment 8, further including forming a metal silicide region between the source or drain contact and the first or second semiconductor source or drain structure, the metal silicide region including a metal from the alloyed metal barrier layer and silicon from the first or second semiconductor source or drain structure.

Example embodiment 10: The method of example embodiment 9, wherein the metal silicide region further includes germanium from the first or second semiconductor source or drain structure.

Example embodiment 11: The method of example embodiment 8, 9 or 10, wherein the alloyed metal barrier layer includes a metal alloy including titanium and a metal or combination of metals selected from the group consisting of aluminum, tungsten, magnesium and aluminum, and hafnium and aluminum.

Example embodiment 12: The method of example embodiment 8, 9 or 10, wherein the alloyed metal barrier layer includes a metal alloy including aluminum and a metal or combination of selected from the group consisting of magnesium, zirconium, tantalum and magnesium, and hafnium.

Example embodiment 13: The method of example embodiment 8, 9, 10, 11 or 12, wherein the alloyed metal barrier layer has a thickness in a range of 0.5 nanometers to 5 nanometers.

Example embodiment 14: The method of example embodiment 8, 9, 10, 11, 12 or 13, wherein the inner conductive structure includes a titanium nitride layer, the titanium nitride layer on the alloyed metal barrier layer.

Example embodiment 15: A computing device includes a board, and a component coupled to the board. The component includes an integrated circuit structure including a semiconductor structure above a substrate. A gate electrode is over the semiconductor structure, the gate electrode defining a channel region in the semiconductor structure. A first semiconductor source or drain structure is at a first end of the channel region at a first side of the gate electrode. A second semiconductor source or drain structure is at a second end of the channel region at a second side of the gate electrode, the second end opposite the first end. A source or drain contact is on the first or second semiconductor source or drain structure, the source or drain contact including an alloyed metal barrier layer and an inner conductive structure.

Example embodiment 16: The computing device of example embodiment 15, further including a memory coupled to the board.

Example embodiment 17: The computing device of example embodiment 15 or 16, further including a communication chip coupled to the board.

Example embodiment 18: The computing device of example embodiment 15, 16 or 17, further including a communication chip coupled to the board.

Example embodiment 19: The computing device of example embodiment 15, 16, 17 or 18, wherein the component is a packaged integrated circuit die.

Example embodiment 20: The computing device of example embodiment 15, 16, 17, 18 or 19, wherein the component is selected from the group consisting of a processor, a communications chip, and a digital signal processor.

What is claimed is:
1. An integrated circuit structure, comprising:
a semiconductor structure above a substrate;
a gate electrode over the semiconductor structure, the gate electrode defining a channel region in the semiconductor structure;
a first semiconductor source or drain structure at a first end of the channel region at a first side of the gate electrode;
a second semiconductor source or drain structure at a second end of the channel region at a second side of the gate electrode, the second end opposite the first end; and
a source or drain contact on the first or second semiconductor source or drain structure, the source or drain contact comprising an alloyed metal barrier layer and an inner conductive structure, wherein the alloyed metal barrier layer has an uppermost surface below an uppermost surface of the inner conductive structure, and wherein the alloyed metal barrier layer has a thickness along a bottom of the inner conductive structure greater than a thickness along sides of the inner conductive structure.

2. The integrated circuit structure of claim 1, further comprising a metal silicide region between the source or drain contact and the first or second semiconductor source or drain structure, the metal silicide region comprising a metal from the alloyed metal barrier layer and silicon from the first or second semiconductor source or drain structure.

3. The integrated circuit structure of claim 1, wherein the metal silicide region further comprises germanium from the first or second semiconductor source or drain structure.

4. The integrated circuit structure of claim 1, wherein the alloyed metal barrier layer comprises a metal alloy comprising titanium and a metal or combination of metals selected from the group consisting of aluminum, tungsten magnesium and aluminum, and hafnium and aluminum.

5. The integrated circuit structure of claim 1, wherein the alloyed metal barrier layer comprises a metal alloy comprising aluminum and a metal or combination of selected from the group consisting of magnesium, zirconium, tantalum and magnesium, and hafnium.

6. The integrated circuit structure of claim 1, wherein the alloyed metal barrier layer has a thickness in a range of 0.5 nanometers to 5 nanometers.

7. The integrated circuit structure of claim 1, wherein the inner conductive structure comprises a titanium nitride layer, the titanium nitride layer on the alloyed metal barrier layer.

8. A method of fabricating an integrated circuit structure, the method comprising:
forming a semiconductor structure above a substrate;
forming a gate electrode over the semiconductor structure, the gate electrode
defining a channel region in the semiconductor structure;
forming a first semiconductor source or drain structure at a first end of the channel region at a first side of the gate electrode;
forming a second semiconductor source or drain structure at a second end of the channel region at a second side of the gate electrode, the second end opposite the first end; and
forming a source or drain contact on the first or second semiconductor source or drain structure, the source or drain contact comprising an alloyed metal barrier layer and an inner conductive structure, wherein the alloyed metal barrier layer has an uppermost surface below an uppermost surface of the inner conductive structure, and wherein the alloyed metal barrier layer has a thickness along a bottom of the inner conductive structure greater than a thickness along sides of the inner conductive structure.

9. The method of claim 8, further comprising forming a metal silicide region between the source or drain contact and the first or second semiconductor source or drain structure, the metal silicide region comprising a metal from the alloyed metal barrier layer and silicon from the first or second semiconductor source or drain structure.

10. The method of claim 8, wherein the metal silicide region further comprises germanium from the first or second semiconductor source or drain structure.

11. The method of claim 8, wherein the alloyed metal barrier layer comprises a metal alloy comprising titanium and a metal or combination of metals selected from the group consisting of aluminum, tungsten, magnesium and aluminum, and hafnium and aluminum.

12. The method of claim 8, wherein the alloyed metal barrier layer comprises a metal alloy comprising aluminum and a metal or combination of selected from the group consisting of magnesium, zirconium, tantalum and magnesium, and hafnium.

13. The method of claim 8, wherein the alloyed metal barrier layer has a thickness in a range of 0.5 nanometers to 5 nanometers.

14. The method of claim 8, wherein the inner conductive structure comprises a titanium nitride layer, the titanium nitride layer on the alloyed metal barrier layer.

15. A computing device, comprising:
a board; and
a component coupled to the board, the component including an integrated circuit structure, comprising:
a semiconductor structure above a substrate;
a gate electrode over the semiconductor structure, the gate electrode defining a channel region in the semiconductor structure;
a first semiconductor source or drain structure at a first end of the channel region at a first side of the gate electrode;
a second semiconductor source or drain structure at a second end of the channel region at a second side of the gate electrode, the second end opposite the first end; and
a source or drain contact on the first or second semiconductor source or drain structure, the source or drain contact comprising an alloyed metal barrier layer and an inner conductive structure, wherein the alloyed metal barrier layer has an uppermost surface below an uppermost surface of the inner conductive structure, and wherein the alloyed metal barrier layer has a thickness along a bottom of the inner conductive structure greater than a thickness along sides of the inner conductive structure.

16. The computing device of claim 15, further comprising:
a memory coupled to the board.

17. The computing device of claim 15, further comprising:
a communication chip coupled to the board.

18. The computing device of claim 15, further comprising:
a camera coupled to the board.

19. The computing device of claim 15, wherein the component is a packaged integrated circuit die.

20. The computing device of claim 15, wherein the component is selected from the group consisting of a processor, a communications chip, and a digital signal processor.

* * * * *